US 8,127,264 B2

(12) United States Patent
Parker et al.

(10) Patent No.: US 8,127,264 B2
(45) Date of Patent: Feb. 28, 2012

(54) METHODS FOR DESIGNING INTEGRATED CIRCUITS EMPLOYING CONTEXT-SENSITIVE AND PROGRESSIVE RULES AND AN APPARATUS EMPLOYING ONE OF THE METHODS

(75) Inventors: James C. Parker, Zionsville, PA (US); Vishwas M. Rao, Breinigsville, PA (US); Lalita M. Satapathy, Bangalore (IN); Todd M. Tope, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 394 days.

(21) Appl. No.: 12/510,122

(22) Filed: Jul. 27, 2009

(65) Prior Publication Data

US 2011/0022996 A1    Jan. 27, 2011

(51) Int. Cl.
*G06F 17/50* (2006.01)
(52) U.S. Cl. .................. 716/136; 716/132; 716/111
(58) Field of Classification Search .................. None
See application file for complete search history.

(56) References Cited

U.S. PATENT DOCUMENTS

| | | | | |
|---|---|---|---|---|
| 5,050,091 | A * | 9/1991 | Rubin | 716/122 |
| 5,175,696 | A * | 12/1992 | Hooper et al. | 716/104 |
| 6,011,911 | A * | 1/2000 | Ho et al. | 716/112 |
| 6,216,252 | B1 * | 4/2001 | Dangelo et al. | 716/102 |
| 7,810,056 | B1 * | 10/2010 | Garg et al. | 716/104 |
| 2010/0058272 | A1 * | 3/2010 | Bowers et al. | 716/12 |

OTHER PUBLICATIONS

Beenker et al., "A Testability Strategy for Silicon Compilers," 1989 Int'l Test Conference, IEEE, pp. 660-669.*
Benaben et al., "A UML-based complex system design method MoFoV (Modeling/ Formalizing/ Verifying)", 2002 IEEE SMC, 6 pages.*
Hedenstierna et al., "The Halo Algorithm—An Algorithm for Hierarchical Design of Rule Checking of VLSI Circuits," IEEE Trans. on CAD of ICs & Systems, vol. 12, No. 2, Feb. 1993, pp. 265-272.*
McGrath et al., "Design Integrity and Immunity Checking: A New Look at Layout Verification and Design Rule Checking," 1980 ACM, pp. 263-268.*
Wagner, "Hierarchical Layout Verification," IEEE Design & Test, Feb. 1985, pp. 31-37.*
Snowdon, et al.; "Power Management and Dynamic Voltage Scaling: Myths and Facts"; National ICT Australia and School of Computer Science and Engineering, University of NSW, Sydney 2052, Australia, dated Sep. 16, 2005, 7 pages.
Kandemir, et al.; "Energy-Conscious Compilation Based on Voltage Scaling"; LCTES02-SCOPES02, Jun. 19-21, 2002, 10 pages.
Masnica, et al.; "Establishing Benchmarks for Analyzing Benefits Associated With Voltage Scaling, Analyzing the Benefits and an Apparatus Therefor"; U.S. Appl. No. 12/510,082, filed Jul. 27, 2009.

(Continued)

*Primary Examiner* — Leigh Garbowski

(57) ABSTRACT

Methods of designing an IC and an apparatus are disclosed. In one embodiment, a method includes: (1) creating a functional circuit for a functional block of an IC design, (2) verifying said functional circuit satisfies a rule-set for said IC design, wherein said rule-set is context-based with respect to said design flow, (3) synthesizing a logical circuit based on the functional circuit; (4) verifying the logical circuit satisfies the rule set; (5) implementing a physical layout of the logical circuit; and (6) verifying the physical layout satisfies the rule set, wherein each step of the method is carried out by at least one EDA tool.

20 Claims, 2 Drawing Sheets

OTHER PUBLICATIONS

Parker, et al.; "A Method for Designing Integrated Circuits Employing a Partitioned Hierarchical Design Flow and an Apparatus Employing the Method"; U.S. Appl. No. 12/510,104, filed Jul. 27, 2009.

Parker, et al.; "Methods for Designing Integrated Circuits Employing Voltage Scaling and Integrated Circuits Designed Thereby"; U.S. Appl. No. 12/364,918, filed Feb. 3, 2009.

Jamann, et al.; "A Systematic Normalized Metric for Analyzing and Comparing Optimization Techniques for Integrated Circuits Employing Voltage Scaling and Integrated Circuits Designed Thereby"; U.S. Appl. No. 12/365,010, filed Feb. 3, 2009.

Jamann, et al.; "A Systematic Benchmarking System and Method for Standardized Data Creation, Analysis and Comparison of Semiconductor Technology Node Characteristics"; U.S. Appl. No. 12/365,084, filed Feb. 3, 2009.

\* cited by examiner

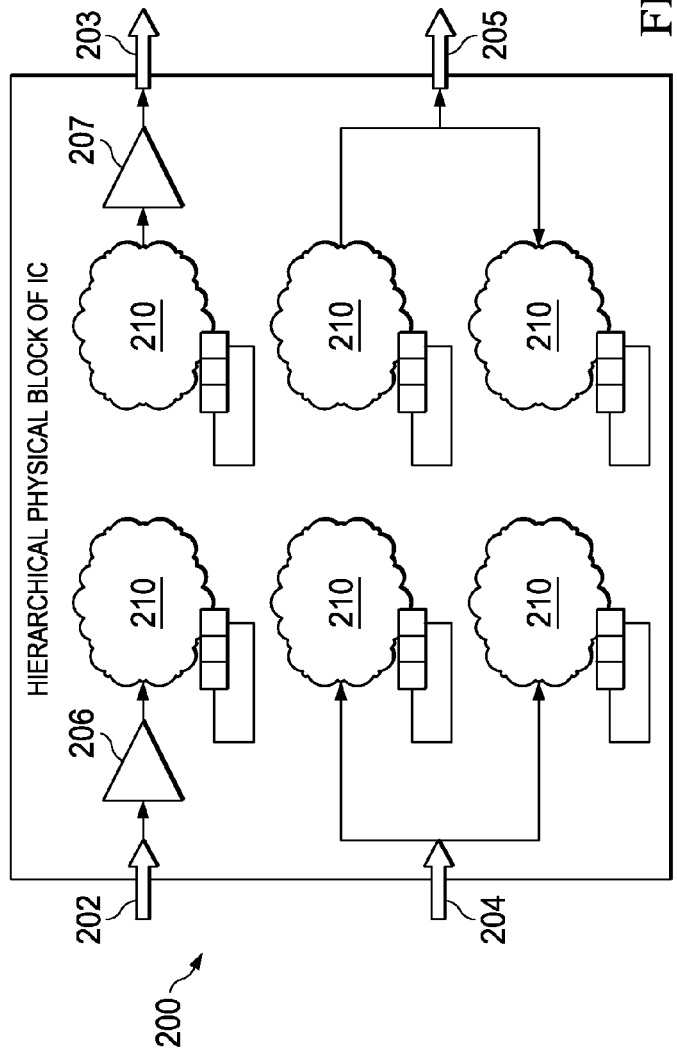

EACH I/O PORT ON THE HIERARCHICAL PHYSICAL BLOCK SHOULD OBEY THE SINGLE-FANIN-SINGLE-FANOUT (SFISFO) RULE:
(A) INPUT PORT OF HIERARCHICAL PHYSICAL BLOCK SHOULD NOT DRIVE MULTIPLE LEAF CELLS (INPUT FANOUT> 1);
(B) OUTPUT PORT OF HIERARCHICAL PHYSICAL BLOCK SHOULD NOT FEED INSIDE THE SAME HIERARCHICAL BLOCK (OUTPUT DRIVER FANOUT> 1);
(C) EACH INPUT PORT SHOULD BE DIRECTLY CONNECTED TO A SINGLE DIODE PROTECTED BUFFER WHICH SHOULD BE PULLED AS CLOSE AS POSSIBLE TO THE PHYSICAL INPUT PIN ON THE HIERARCHICAL PHYSICAL BLOCK;
(D) EACH OUTPUT PORT SHOULD BE DIRECTLY DRIVEN BY A SINGLE BUFFER WHICH SHOULD BE PULLED AS CLOSE AS POSSIBLE TO THE PHYSICAL OUTPUT PIN ON THE HIERARCHICAL PHYSICAL BLOCK.

METHODS FOR DESIGNING INTEGRATED CIRCUITS EMPLOYING CONTEXT-SENSITIVE AND PROGRESSIVE RULES AND AN APPARATUS EMPLOYING ONE OF THE METHODS

CROSS REFERENCE TO RELATED APPLICATIONS

This application is related to the following U.S. Patent Applications, which are commonly assigned herewith and incorporated herein by reference in their entirety:

Ser. No. 12/510,082, filed by Masnica, et al., on even date herewith and entitled, "Establishing Benchmarks For Analyzing Benefits Associated With Voltage Scaling, Analyzing The Benefits And An Apparatus Therefor;" and Ser. No. 12/510,104, filed by Parker, et al., on even date herewith and entitled, "A Method For Designing Integrated Circuits Employing A Partitioned Hierarchical Design Flow And An Apparatus Employing The Method."

This application is also related to the following non-provisional applications commonly assigned with the invention and incorporated herein by reference: U.S. patent application Ser. No. 12/364,918 filed by Parker, et al., on Feb. 3, 2009, entitled "Methods for Designing Integrated Circuits Employing Voltage Scaling and Integrated Circuits Designed Thereby," U.S. patent application Ser. No. 12/365,084 filed by Jamann, et al., on Feb. 3, 2009, entitled "A Systematic Benchmarking System and Method for Standardized Data Creation, Analysis and Comparison of Semiconductor Technology Node Characteristics" and U.S. patent application Ser. No. 12/365,010 filed by Jamann, et al., on Feb. 3, 2009, entitled "A Systematic, Normalized Metric for Analyzing and Comparing Optimization Techniques for Integrated Circuits Employing Voltage Scaling and Integrated Circuits Designed Thereby."

TECHNICAL FIELD

This application is directed, in general, to integrated circuits (ICs) and, more specifically, to directing IC designs to convergence through a hierarchical design flow.

BACKGROUND

Designers of ICs use electronic design automation (EDA) tools, a category of computer aided design (CAD) tools, to create a functional circuit design, including a register transfer level (RTL) representation of the functional circuit design, synthesize a "netlist" from the RTL representation, and implement a layout from the netlists. Synthesis of the netlist and implementation of the layout involve simulating the operation of the circuit and determining where cells should be placed and where interconnects that couple the cells together should be routed. EDA tools allow designers to construct a circuit, simulate its performance, estimate its power consumption and area and predict its yield using a computer and without requiring the costly and lengthy process of fabrication. EDA tools are indispensable for designing modern ICs, particularly very-large-scale integrated circuits (VSLICs). For this reason, EDA tools are in wide use.

Multiple EDA tools may be used when designing an IC. To manage the combination of the EDA tools that are used to design an IC, design flows are typically used. One type of design flow supports a hierarchical design methodology that allows designers to address problems on the physical side of the design process between logic synthesis and the implementation process. Through early analysis and floor planning, designers can apply physical constraints to assist in controlling the initial implementations of an IC design. Floor planning involves planning for the placement of components in an IC such as a Systems-on-Chip (SoC) where large hierarchical blocks are integrated. With a hierarchical design flow, EDA tools can allow a designer to reduce the number of iterations that occur post-RTL (assuming RTL is good) to create a realizable SoC. The iterations primarily occur to meet the design timing, power, area, etc.

Current hierarchical design flows may be derived from two dominant design methodologies, top-down and bottom-up. Typically, commercial methodologies are targeted at top-down design and in-house methodologies target bottom-up design gap that commercial methodologies do not accommodate. Design teams may also craft their own local methods for IC design. While these methods may be effective in local situations, local design methods may include assumptions that can prove to be ineffective in reaping the full benefits of a hierarchical design flow. This may be especially true when the hierarchical design flow is being used for parallel development over geographically distributed design teams. For example, in a geographically distributed organization, the true benefits of a hierarchical design flow can be achieved when designs are hierarchically split and geographically distributed for parallel execution. Communication problems between the various design teams, however, can lead to a final IC design that does not function properly or at least can delay achieving a workable final IC design.

SUMMARY

One aspect provides a method of designing an IC employing a hierarchical design flow. In one embodiment, the method includes: (1) creating a functional circuit for a functional block of an IC design, (2) verifying said functional circuit satisfies a rule-set for said IC design, wherein said rule-set is context-based with respect to said design flow, (3) synthesizing a logical circuit based on the functional circuit; (4) verifying the logical circuit satisfies the rule set, (5) implementing a physical layout of the logical circuit, and (6) verifying the physical layout satisfies the rule set, wherein each step of the method is carried out by at least one EDA tool.

Another embodiment of a method of designing an IC is also disclosed. In this other embodiment, the method includes: (1) employing at least a first EDA tool to create a functional circuit of an IC design, synthesize a logical circuit based on the functional circuit and implement a physical layout of the logical circuit, (2) employing at least a second EDA tool for verifying that each of the functional circuit, the logical circuit and the physical layout satisfies a rule-set for the IC design, wherein the rule-set is context-based and progressive and (3) modifying the functional circuit, the logical circuit or the physical layout if needed according to the verifying.

In yet another aspect, an apparatus is disclosed. In one embodiment the apparatus, includes: (1) an analyzer configured to compare a context stage of a hierarchical design flow of an IC design with a rule-set of the IC design and (2) a verifier configured to determine compliance of the context stage with the rule-set, wherein the rule-set is context-based.

BRIEF DESCRIPTION

Reference is now made to the following descriptions taken in conjunction with the accompanying drawings, in which:

FIG. 1 illustrates an example of a rule 100 for a HDR rule-set created according to the principles of the present disclosure;

FIG. 2 illustrates a schematic of an embodiment of a hierarchical physical block 200 of an IC design;

DETAILED DESCRIPTION

Figure 3:
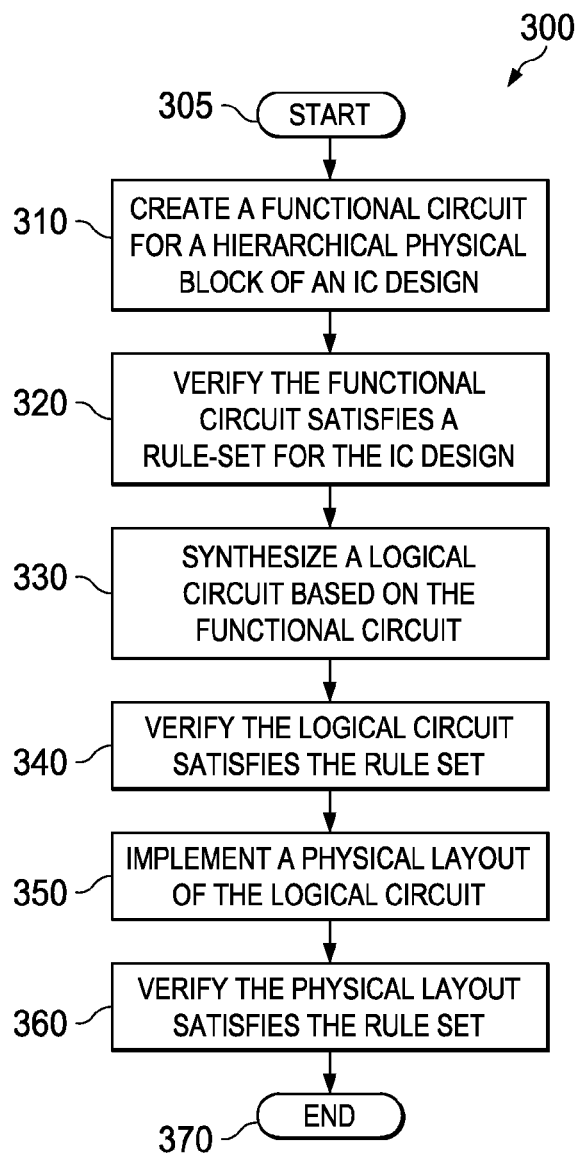
FIG. 3 illustrates an embodiment of a method 300 of designing an IC carried out according to the principles of the present disclosure.

Employing geographically distributed design teams carries the risk of non-convergence of the IC design due to hidden assumptions and communication gaps in the design process between, for example, the diverse design teams. Moreover, the design flow may go through multiple context stages (e.g., functional, logical and physical) and it is important that the assumptions and communications between the design teams are consistent across these various context stages. As such, non-convergence of the IC design can be an unwanted risk and a formidable threat to the hierarchical design process. As such, this disclosure provides a modulating decision making process along the design flow of an IC by employing context-sensitive rule-checking that leads to convergence of the IC design (i.e., a finished IC design that functions as intended).

The disclosure provides a progressive hierarchical design rule (HDR) based approach to IC design. The HDR approach includes a rule-set that is progressive by having rules that consider the maturity of the design flow. Additionally, the rule-set is context-sensitive by having rules that are adaptable to the various context-stages of the design flow. The number of rules in the rule-set is also relatively small and targeted at modulating the design decision-making process to enable convergence. Thus, instead of being directed to catching mistakes that have already been made upstream in the design flow, the disclosure provides a rule-set that is directed to preventing mistakes from moving downstream in the design flow. This HDR based approach allows a design team to retain flexibility and innovation while also de-risking the hierarchical design flow. By having a small number of rules in a given HDR rule-set, learning and communications between the design teams can also be improved.

FIG. 1 illustrates an example of a rule 100 for a HDR rule-set created according to the principles of the present disclosure. The rule 100 is directed to single-fanin-single-fanout (SFISFO) and gasket-buffering for an IC design. Gasket buffering refers to adding isolation buffers at the input and the output ports of a functional block of the IC design. The rule 100 includes multiple requirements that are identified as requirement A, B, C and D. As will be demonstrated below, the requirements A-D of the rule 100 may be progressive as the design flow matures.

FIG. 2 illustrates a schematic of an embodiment of a hierarchical physical block 200 of an IC design. The hierarchical physical block 200 represents a portion of the IC design at the logical context-stage. The hierarchical physical block 200 includes two input ports, input port 202 and input port 204, and two output ports, output port 203 and output port 205. An input diode 206 and an output diode 207 are also included. The hierarchical physical block 200 also includes logic circuitry 210 that is represented by the various clouds in FIG. 2.

Auditing of the rule 100 with respect to the hierarchical physical block 200 may be performed by an apparatus such as an EDA tool. For example, the apparatus described with respect to FIG. 4 may be used. Auditing of the rule 100 may occur for each context stage of the design flow. At the logical context-stage, several of the requirements of the rule 100 are applicable. For example, according to Requirement A, each input port of the 200 should have an input fanout that is greater than one (i.e., Input Fanout>1). Additionally, Requirement B addresses output ports and requires that output driver fanout should be greater than one (i.e., Output Driver Fanout>1). As indicated in FIG. 2, input port 204 violates Requirement A and output port 205 violates Requirement B.

Portions of Requirement C and Requirement D of rule 100 also apply to the logical context-stage of the design flow. As evident from FIG. 2, input port 202 complies with part of Requirement C that requires each input port to be directly connected to a single diode protected buffer. At this context-stage of the design flow, verification of a portion of Requirement C is not possible. In other words, verifying whether the diode-protected buffer is pulled as close as possible to the physical input pin on the 200 needs to be determined at a later context-stage of the design flow.

Similarly, a portion of Requirement D can be determined at the logical context-stage by verifying that each output port should be directly driven by a single buffer. Output port 203 satisfies this portion of Requirement D by being coupled to the output diode 207. The remaining portion of Requirement D will be determined at a later context-stage of the design flow. Input port 204 and output port 205 violate the buffer requirements of Requirements C and D, respectively. As such, a flag or warning may be generated to indicate a violation of the rule 100, or more specifically, a specific Requirement of the rule 100. The warning may indicate the type of violation and the location of the violation. A designer, therefore, can correct the violation at the present context-stage that the violation was recognized. Accordingly, violations can be corrected before moving downstream in the design flow.

In another context-stage of the design flow other portions of the rule 100 may become applicable. The logical implementation of the IC design (i.e., the gate netlist) may be physically implemented in a layout database. At this time, the distance between the input/output ports and associated buffers need to be checked. An EDA tool may also be used to verify this portion of the rule 100. In some embodiments, a different EDA tool may be used than the EDA tool used at the logical context-stage. The EDA tool employed for this analysis and verification may be a physical domain audit tool. The EDA tool at the physical context-stage may progressively extend the rule 100 and check the distance requirements thereof. Additionally, the EDA tool may also check or check again the other portions of the rule 100 to ensure seamless compliance across the design flow. The verification at the physical context-stage may be carried out inside the layout environment ensuring that there are no environment related gaps in the audit.

FIG. 3 illustrates a flow diagram of an embodiment of a method 300 for designing an IC employing a hierarchical design flow. Each step of the method 300 may be accomplished by employing an EDA tool or a plurality of EDA tools. As such, different EDA tools may be used for each step of the method 300 or for at least two different steps of the method 300. Some of the EDA tools, such as for synthesizing and implementing, may be commercially available tools that are commonly used for IC design. In some embodiments, proprietary EDA tools may also be used. The method 300 may also be accomplished by multiple design teams that can be geographically distributed throughout the world. The method 300 begins in a step 305.

In a step 310, a functional circuit is created for a hierarchical physical block of an IC design. The functional circuit may be represented as an RTL. The functional circuit is then verified to satisfy a rule-set for the IC design in a step 320. Violations of the rule-set may be indicated in a report. If violations of the rule-set are determined, a designer or design team may correct the violations before proceeding to the next stage of the design flow.

The rule-set is context-based with respect to design flow and is progressively applied along the design flow. The rule-set is designed to facilitate convergence of the IC design at the end of the design flow to provide a closed design. At least one rule of the rule-set may include multiple requirements that are context-based. Some rules may include a variable that is applicable to a specific technology node or design. For example, a specific isolation distance may need to be maintained for an IC design. The isolation distance may vary, however, between different technology nodes. The distance can be adjusted in the rule-set depending on the technology node or design. The rules of the rule-set, therefore, may be applied across different technology nodes and, as such, are technology-node independent.

In some embodiments, each rule of the rule-set is directed to a compliance requirement for the IC design. The rule-set may have a minimum number of rules that are sufficient to lead the IC design to convergence. In one embodiment with a rule-set directed to compliance, the rule set may include a maximum of twenty rules. In other embodiments, the rule-set may include information guidelines for the IC design instead of compliance requirements. Thus a small set (e.g., between 20 to 30 rules) of hierarchical design rules can be used for the design process. As the design flow matures, some rules of the rule-set may include a greater number of compliance requirements or information guidelines that are applicable. As such, the rules are overloaded, i.e., they become stronger and check for more things as the context switches from functional through logical through physical as the method 300 progresses.

Thereafter, a logical circuit is synthesized based on the functional circuit in a step 330. Typically, the functional circuit that is used is free from violations of the rule-set. In other words, detected violations were corrected. An EDA tool may be used to synthesize the logical circuit. The logical circuit is then verified to satisfy the rule set in a step 340.

A physical layout of the logical circuit is then implemented in a step 350. Again, the logical circuit used for the physical layout is typically free of rule-set violations. The physical layout may involve placing and routing. In a step, 360, verification that the physical layout satisfies the rule set is then performed. In step 360, as with each verification step of the method 300, a design team can correct the present context-stage of the IC design to conform to the rule set. The method 300 then ends in a step 370.

Figure 4:
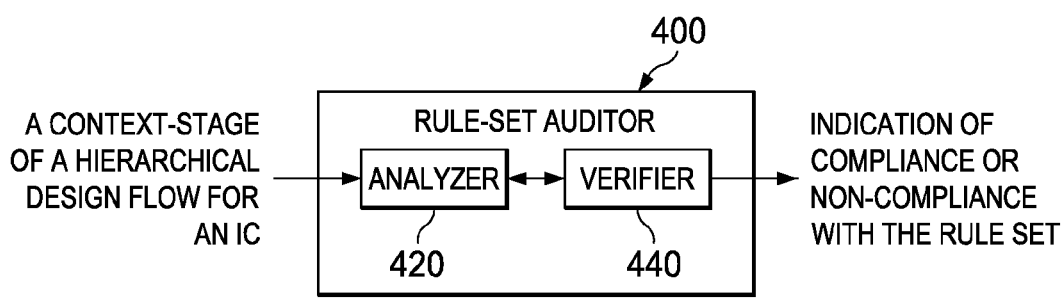
FIG. 4 illustrates an embodiment of a rule-set auditor constructed according to the principles of the present disclosure.

FIG. 4 illustrates a block diagram of an embodiment of a rule-set auditor 400 constructed according to the principles of the present disclosure. The rule-set auditor 400 may be embodied as a series of operating instruction stored on a computer-readable medium that directs the operation of a processor when initiated thereby. In one embodiment, the rule-set auditor 400 may be a dedicated computing device including the necessary circuitry (including a processor and memory) or software to perform the described functions. To perform the described functions, the rule-set auditor 400 may include a series of operating instructions stored on a computer-readable medium that direct the operation of a processor when initiated thereby. The rule-set auditor 400 may be an EDA tool. In some embodiments, the rule-set auditor 400 may be a proprietary EDA tool. The rule-set auditor 400 includes an analyzer 420 and a verifier 440. In some embodiments, the rule-set auditor 400 may be configured to compare and verify a single type of context-stage. For example, the rule-set auditor 400 may only be designed to audit functional circuits with respect to a rule-set. As such, multiple EDA tools may be used throughout the design process to not only generate different context-stages but also to audit the different context-stages.

The analyzer 420 is configured to compare a context stage of a hierarchical design flow of an IC design with a rule-set of the IC design. The context-stage may be, for example, functional, logical or physical. The verifier 440 is configured to determine compliance of the context stage with the rule-set and may be configured to adjust determining compliance with the rule-set based on a maturity of the IC design. The rule-set is context-based and may have a maximum of twenty rules. In one embodiment, the rule-set includes different categories of rules for the IC design including clock/reset rules, connectivity rules, timing rules and physical rules. Each of these categories may include general rules that are applicable for the complete IC design. The rule-set can be applied to each functional block of the design flow.

Those skilled in the art to which this application relates will appreciate that other and further additions, deletions, substitutions and modifications may be made to the described embodiments.

What is claimed is:

1. A method of designing an integrated circuit employing a hierarchical design flow, comprising:
   (a) creating a functional circuit for a functional block of an IC design;
   (b) verifying said functional circuit satisfies a rule-set for said IC design, wherein said rule-set is context-based with respect to said hierarchical design flow;
   (c) synthesizing a logical circuit based on said functional circuit;
   (d) verifying said logical circuit satisfies said rule-set;
   (e) implementing a physical layout of said logical circuit; and
   (f) verifying said physical layout satisfies said rule-set, wherein each step of said method is carried out by at least one EDA tool.

2. The method as recited in claim 1 wherein said steps a-f are performed for multiple functional blocks of said IC design.

3. The method as recited in claim 2 wherein at least some of said steps a-f are performed in parallel.

4. The method as recited in claim 1 wherein said hierarchical design flow includes a functional context, a logical context and a physical context.

5. The method as recited in claim 1 wherein said rule-set is configured to facilitate convergence of said IC design.

6. The method as recited in claim 1 wherein at least one rule of said rule-set includes multiple requirements that are context-based.

7. The method as recited in claim 1 wherein each rule of said rule-set is directed to a compliance requirement for said IC design.

8. The method as recited in claim 7 wherein said rule-set includes different categories of rules selected from the group consisting of:
   clock/reset rules,
   connectivity rules
   timing rules, and
   physical rules.

9. The method as recited in claim 1 wherein said rule-set includes information guidelines for said IC design.

10. The method as recited in claim 1 wherein at least some rules of said rule-set include a greater number of compliance requirements as said hierarchical design flow matures.

11. A method of designing an integrated circuit, comprising:
   employing at least a first EDA tool to create a functional circuit of an IC design, synthesize a logical circuit based on said functional circuit and implement a physical layout of said logical circuit;
   employing at least a second EDA tool for verifying that each of said functional circuit, said logical circuit and said physical layout satisfies a rule-set for said IC design, wherein said rule-set is context-based and progressive;
   modifying said functional circuit, said logical circuit or said physical layout if needed according to said verifying.

12. The method as recited in claim 11 wherein said rule-set has a maximum of twenty rules.

13. The method as recited in claim 11 wherein at least one rule of said rule-set includes at least one requirement that is context-based.

14. The method as recited in claim 11 wherein said rule-set includes different categories of rules selected from the group consisting of:
   clock/reset rules,
   connectivity rules,
   timing rules and
   physical rules.

15. The method as recited in claim 11 wherein said rule-set includes rules designed to facilitate convergence of said IC design.

16. An apparatus, comprising:
   an analyzer configured to compare a context stage of a hierarchical design flow of an IC design with a rule-set of said IC design; and
   a verifier configured to determine compliance of said context stage with said rule-set, wherein said rule-set is context-based.

17. The apparatus as recited in claim 16 wherein said rule-set includes different categories of rules selected from the group consisting of:
   clock/reset rules, and
   connectivity rules.

18. The apparatus as recited in claim 16 wherein said verifier is configured to adjust determining compliance with said rule-set based on a maturity of said IC design.

19. The apparatus as recited in claim 16 wherein said rule-set includes different categories of rules selected from the group consisting of:
   timing rules and
   physical rules.

20. The apparatus as recited in claim 16 wherein said rule-set is applicable for each functional block of said hierarchical design flow.

* * * * *